US007208042B2

(12) United States Patent
Harada et al.

(10) Patent No.: US 7,208,042 B2
(45) Date of Patent: Apr. 24, 2007

(54) METHOD OF MANUFACTURING SILICON SINGLE CRYSTAL AND SILICON SINGLE CRYSTAL MANUFACTURED BY THE METHOD

(75) Inventors: Kazuhiro Harada, Tokyo (JP); Yoji Suzuki, Tokyo (JP); Hidenobu Abe, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 518 days.

(21) Appl. No.: 10/769,367

(22) Filed: Jan. 30, 2004

(65) Prior Publication Data

US 2005/0263063 A1 Dec. 1, 2005

(30) Foreign Application Priority Data

Jan. 31, 2003 (JP) ............................. 2003-023148

(51) Int. Cl.
*C30B 15/20* (2006.01)

(52) U.S. Cl. ............................. 117/13; 117/14; 117/19; 117/20

(58) Field of Classification Search ................ 117/13, 117/14, 19, 20, 201, 202
See application file for complete search history.

(56) References Cited

U.S. PATENT DOCUMENTS

| 5,593,498 A | * | 1/1997 | Kimbel et al. ............... 117/201 |
| 5,766,341 A | * | 6/1998 | Kimbel et al. ................ 117/14 |
| 6,045,610 A | | 4/2000 | Park et al. |

FOREIGN PATENT DOCUMENTS

JP 11-1393 1/1999

* cited by examiner

*Primary Examiner*—Felisa Hiteshew
(74) *Attorney, Agent, or Firm*—Reed Smith LLP (57) ABSTRACT

A silicon single crystal ingot is pulled at a pull rate so that the interior of the ingot results in a perfect region in which agglomerates of interstitial silicon-type point defects and agglomerates of vacancy-type point defects are absent, while rotating a quartz crucible for storing a silicon melt at a predetermined rotation speed and rotating the ingot pulled from the silicon melt in the opposite direction to the rotation of the quartz crucible at a predetermined rotation speed. An average rotation speed $CR_{TAV}$ of the quartz crucible during the pulling of a top ingot portion is set to be faster than an average rotation speed $CR_{TAV}$ of the quartz crucible during the pulling of a bottom ingot portion of the silicon single crystal ingot.

18 Claims, 6 Drawing Sheets

METHOD OF MANUFACTURING SILICON SINGLE CRYSTAL AND SILICON SINGLE CRYSTAL MANUFACTURED BY THE METHOD

BACKGROUND OF THE INVENTION

This application claims Paris Convention priority of Japanese Application No. 2003-023148 filed Jan. 31, 2003, the entire disclosure of which is hereby incorporated by reference.

The present invention relates to a method of manufacturing a silicon single crystal ingot by pulling it from a silicon melt at a pull rate such that the interior of the silicon single crystal ingot becomes a perfect region. The invention also relates to ingots manufactured by this method.

Conventionally, a method of pulling a silicon single crystal ingot according to a Czochralski method (hereinafter also referred to as a CZ method) has been known as a method of manufacturing silicon single crystal ingots. In the CZ method, a silicon melt stored in a quartz crucible is brought into contact with a seed crystal and the seed crystal is pulled up while rotating the quartz crucible and the seed crystal, whereby a columnar silicon single crystal ingot is manufactured.

Meanwhile, it has been pointed out that yield reduction in a process of manufacturing semiconductor integrated circuits arises from the presence of microdefects of oxygen precipitates that become nuclei of oxidation induced stacking fault (hereinafter referred to as "OSF"), crystal originated particle, (hereinafter referred to as "COP"), interstitial-type large dislocation (hereinafter referred to as "L/D") and the like. The microdefects that become the nuclei of OSF are introduced during crystal growth, and OSF is exposed during a thermal oxidation process or the like in the manufacture of semiconductor devices, causing faults in the manufactured devices, such as an increase in leakage current. COP is a pit arising from a crystal that is detected on a wafer surface when the silicon wafer that has undergone a mirror polishing is washed with a mixed solution of ammonia and hydrogen peroxide. The pit is also detected as a light scattering defect along with real particles when the wafer is measured with a particle counter.

COP becomes a cause of deteriorating electrical characteristics, such as a time dependent dielectric breakdown (TDDB) characteristic and a time zero dielectric breakdown (TZDB) characteristic of oxide films. In addition, COP existing on a wafer surface can create a height difference in a wiring process of devices, which can become a cause of wire breakage. Moreover, it becomes a cause of leakage in element-isolating portions, lowering product yield. L/D is also called dislocation cluster, or dislocation pit, because the silicon wafer containing this defect produces a pit when immersed in a selective etchant solution containing hydrofluoric acid as a main component. This L/D also becomes a cause of deteriorating electrical characteristics, such as leakage characteristics, isolation characteristics, and the like. For these reasons, it has been necessary to reduce OSF, COP, and L/D defects in silicon wafers used in the manufacture of semiconductor integrated circuits.

A method of manufacturing a single crystal silicon ingot for cutting out defect-free silicon wafers having no OSF, COP, and L/D defects has been disclosed (see, for example, U.S. Pat. No. 6,045,610 and the corresponding Japanese Unexamined Patent Publication No. 11-1393). Generally, pulling a silicon single crystal ingot at a fast rate produces a region [V] inside the ingot in which agglomerates of vacancy-type point defects are present dominantly, whereas pulling the ingot at a slow rate forms a region [I] inside the ingot in which agglomerates of interstitial silicon-type point defects are present dominantly. In view of this, by pulling an ingot at an optimum pull rate, the above-mentioned manufacturing method makes it possible to manufacture a silicon single crystal ingot made of a perfect region [P] in which the agglomerates of the point defects do not exist.

In the above-described conventional method of manufacturing a silicon single crystal ingot, however, it is necessary to control the axial temperature gradient in the vicinity of the solid-liquid interface between the silicon single crystal ingot and the silicon melt so that it becomes uniform. This control is affected by a change in the remaining quantity of the silicon melt and a change in its convection. For this reason, it has been difficult to manufacture a silicon single crystal ingot that is defect-free over the entire length of the straight cylindrical body of the ingot.

SUMMARY OF THE INVENTION

It is an object of the present invention to provide a method of manufacturing a silicon single crystal ingot wherein the axial temperature gradient in the vicinity of the above-mentioned solid-liquid interface can be made substantially uniform relatively easily, and consequently it is made possible to pull a silicon single crystal ingot in which agglomerates of point defects do not occur in the pulling direction of the silicon single crystal ingot and a perfect region results substantially over the entire length and entire diameter.

A first aspect of the present invention is in an improvement of a method of manufacturing a silicon single crystal, comprising rotating a quartz crucible for storing a silicon melt at a predetermined rotation speed, rotating a silicon single crystal ingot (hereinafter simply referred to as an "ingot") pulled from the silicon melt at a predetermined rotation speed in an opposite direction to the rotation of the quartz crucible, and pulling the silicon single crystal ingot at a pull rate such that an interior of the silicon single crystal ingot becomes a perfect region in which agglomerates of interstitial silicon-type point defects and agglomerates of vacancy-type point defects are absent; and the feature of the configuration is that an average rotation speed $CR_{TAV}$ of the quartz crucible during the pulling of a top ingot portion of the ingot is set faster than an average rotation speed $CR_{BAV}$ of the quartz crucible during the pulling of a bottom ingot portion of the ingot.

Here, in the present specification, the term "perfect region" is meant to include a perfect region containing intrinsic point defects in which vacancies are predominant and a perfect region containing intrinsic point defects in which interstitial silicon is predominant.

A second aspect of the present invention is that a ratio $SR_{TAV}/CR_{TAV}$ of an average rotation speed $SR_{TAV}$ of the silicon single crystal ingot and an average rotation speed $CR_{TAV}$ of the quartz crucible during the pulling of a top ingot portion of the silicon single crystal ingot is set to be equal to or smaller than a ratio $SR_{BAV}/CR_{BAV}$ of an average rotation speed $SR_{BAV}$ of the ingot and an average rotation speed $CR_{BAV}$ of the quartz crucible during the pulling of a bottom ingot portion of the silicon single crystal ingot.

DETAILED DESCRIPTION OF THE INVENTION

Figure 1:
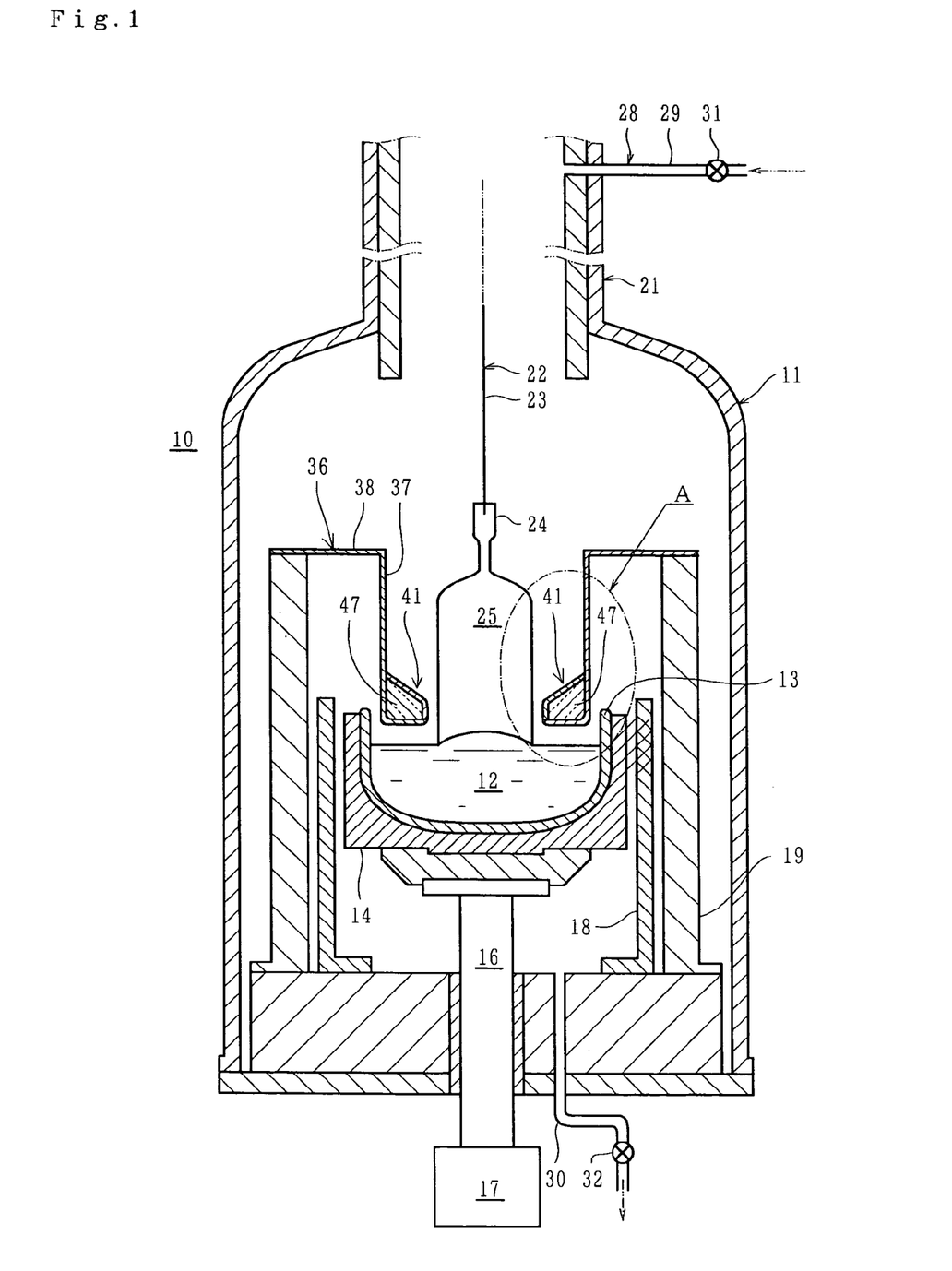
FIG. 1 is a cross-sectional configuration view showing the configuration of pulling equipment used for a method of the present invention.

As shown in FIG. 1, a quartz crucible 13 for storing a silicon melt 12 is provided in a chamber 11 of silicon single crystal-pulling equipment 10, and the outer circumferential surface of the quartz crucible 13 is surrounded by a graphite susceptor 14. The lower face of the quartz crucible 13 is fixed to the upper end of a spindle 16 with the graphite susceptor 14 interposed, and the lower end of the spindle 16 is connected to a crucible drive means 17. Although not shown in the figure, the crucible drive means 17 has a first rotating motor for rotating the quartz crucible 13 and a lifting/lowering motor for lifting and lowering the quartz crucible 13 so that, with these motors, the quartz crucible 13 can rotate in a predetermined direction and can move up and down. The outer circumferential surface of the quartz crucible 13 is surrounded by a heater 18 placed at a predetermined gap from the quartz crucible 13, and the heater 18 is surrounded by a heat-insulating cylinder 19. The heater 18 heats and melts high-purity polycrystalline silicon charged into the quartz crucible 13 to produce a silicon melt 12.

A cylindrical-shaped casing 21 is connected to the upper end of the chamber 11. The casing 21 is provided with a pulling means 22. The pulling means 22 comprises: a pulling head (not shown) provided at the upper end of the casing 21 so that it can pivot horizontally; a second rotating motor (not shown) for rotating the head; a wire cable 23 hanging from the head toward the center of rotation of the quartz crucible 13; and a pulling motor (not shown) provided in the head, for winding and unwinding the wire cable 23. Attached to the lower end of the wire cable 23 is a seed crystal 24 that is immersed in the silicon melt 12, for pulling a silicon single crystal ingot 25.

Also connected to the chamber 11 is a gas supply and exhaust means 28 for supplying an inert gas to the ingot side of the chamber 11 and for exhausting the inert gas from the inner circumferential surface side of the crucible in the chamber 11. The gas supply and exhaust means 28 comprises: a supply pipe 29 one end of which is connected to a surrounding wall of the casing 21 and the other end of which is connected to a tank (not shown) for storing the inert gas; and an exhaust pipe 30 one end of which is connected to the lower wall of the chamber 11 and the other end of which is connected to a vacuum pump (not shown). The supply pipe 29 and the exhaust pipe 30 are provided with first and second flow rate-adjusting valves 31 and 32 for adjusting the flow rates of the inert gas flowing through these pipes 29 and 30, respectively.

An output shaft (not shown) of the pulling motor is provided with an encoder (not shown), and the crucible drive means 17 is also provided with an encoder (not shown) for detecting the up/down position of the spindle 16. The detection outputs from the two encoders are connected to a control input of a controller (not shown), and control outputs of the controller are connected to the pulling motor of the pulling means 22 and to the lifting/lowering motor of the crucible drive means 17. The controller is provided with a memory (not shown), and the memory stores a winding length of the wire cable 23, that is, a pulling length for the ingot 25 in relation to detection output of the encoders, as a first map. The memory also stores a liquid surface level of the silicon melt 12 in the quartz crucible 13 in relation to the pulling length for the ingot 25, as a second map. The controller is so configured as to control the lifting/lowering motor of the crucible drive means 17 so that the liquid surface of the silicon melt 12 in the quartz crucible 13 can be kept at a constant level at all times based on the detection output from the encoder in the pulling motor.

Figure 2:
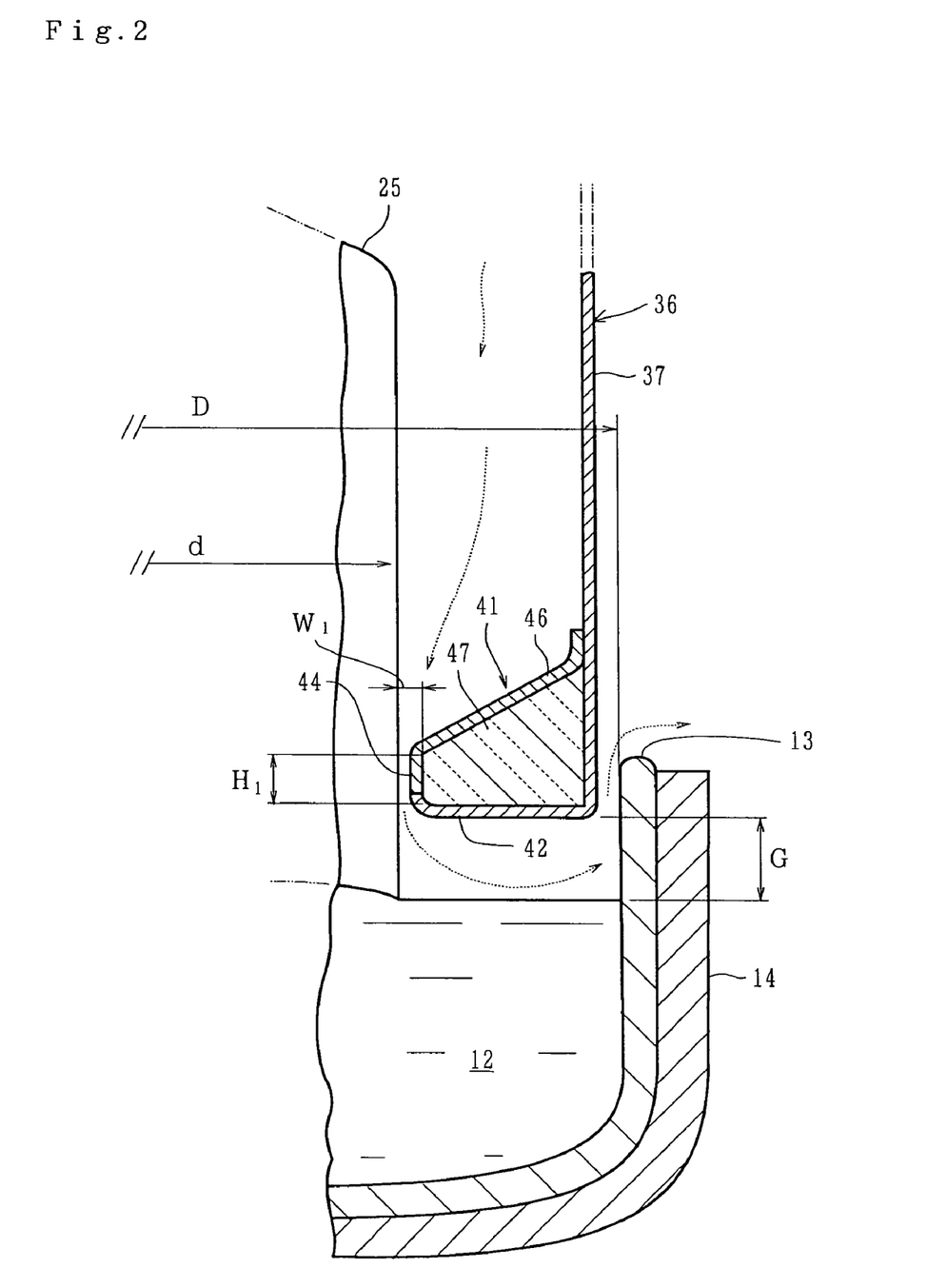
FIG. 2 is an enlarged cross-sectional view of a portion A of FIG. 1, showing a heat shield member of the equipment.

A heat shield member 36 that surrounds the outer circumferential surface of the ingot 25 is provided between the outer circumferential surface of the ingot 25 and the inner circumferential surface of the quartz crucible 13 (see FIGS. 1 and 2). The heat shield member 36 has a cylindrical portion 37 that is formed in a cylindrical shape and is for shielding radiant heat from the heater 18, and a flange portion 38 that is continuously formed on the upper edge of the cylindrical portion 37 and extends outward substantially horizontally. By placing the flange portion 38 on the heat-insulating cylinder 19, the heat shield member 36 is fixed in the chamber 11 so that the lower edge of the cylindrical portion 37 is positioned above the surface of the silicon melt 12 at a predetermined distance. In this embodiment, the cylindrical portion 37 is a cylindrical-shaped body, and the lower portion of the cylindrical portion 37 is provided with a bulging portion 41 bulging inwardly of the cylindrical portion.

As shown in FIG. 2, the bulging portion 41 is composed of: a ring-like bottom wall 42 that is connected to the lower edge of the cylindrical portion 37 and extends horizontally toward the vicinity of the outer circumferential surface of the ingot 25; a vertical wall 44 continuously formed on the inner edge of the bottom wall 42; and an upper wall 46 continuously formed on the upper edge of the vertical wall 44. In this embodiment, the cylindrical portion 37 and the bottom wall 42 are integrally formed, and the upper wall 46 and the vertical wall 44 are integrally formed. It is preferable that the cylindrical portion 37, the bottom wall 42, the vertical wall 44 and the upper wall 46 be made of thermally stable, high purity graphite or graphite the surface of which is coated with SiC; however, it is also possible to employ such materials as Mo (molybdenum) and W (tungsten) which are thermally stable.

The upper wall 46 is formed so that its diameter is larger as it extends upward or as it extends horizontally, and it is configured so that its upper edge continues with the cylindrical portion 37. It should be noted that the interior of the bulging portion 41 that is surrounded by a lower portion of the cylindrical portion 37, the bottom wall 42, the vertical wall 44, and the upper wall 46 is provided with a ring-shaped heat-storing member 47. In this embodiment, the heat-storing member 47 is formed by filling a felt material made of carbon fibers in the interior of the bulging portion 41.

The heat-storing member 47 provided in the interior of the bulging portion 41 is formed to have an inner circumferential surface that is formed by the vertical wall 44 forming the bulging portion 41 and is parallel to the axial centerline of the ingot 25. The height $H_1$ of the inner circumferential surface of the heat-storing member 47 is configured to be in the range of 10 to d/2 mm, where the diameter of the ingot 25 is d mm; the minimum gap $W_1$ between the inner circumferential surface of the heat-storing member 47 and the outer circumferential surface of the ingot 25 is configured to be within the range of 10 to 0.2 d mm; and the gap G between the lower end of the heat shield member 36 and the surface of the silicon melt 12 is configured to be in the range of 40 to 200 mm. It should be noted the height $H_1$ of the inner circumferential surface of the heat-storing member 47 is controlled to be in the range of 10 to d/2 mm, the minimum gap $W_1$ between the inner circumferential surface of the heat-storing member 47 and the outer circumferential surface of the ingot 25 is controlled to be in the range of 10 to 0.2 d mm, and the above-described gap G is controlled to be in the range of 40 to 200 mm mainly for the following reason; the periphery of the ingot 25 further below the bulging portion 41 and in the vicinity of the silicon melt is actively heated by intense heat from the heater 18 and the silicon melt 12, to prevent an abrupt temperature decrease of the outer circumference portion of the ingot 25 in the vicinity of the solid-liquid interface of the ingot 25.

Now, a first method of manufacturing an ingot using the pulling equipment thus configured is described below.

First, by adjusting the first and second flow rate-adjusting valves 31 and 32, an inert gas is supplied from the upper portion of the chamber 11 to the interior of the chamber 11, and the flow rate of the inert gas in the chamber 11 is adjusted so that a flow velocity index S of the inert gas flowing down between the bulging portion 41 of the heat shield member 36 and the ingot 25 is 2.4 to 5.0 m/second. Here, the flow velocity index S is a value obtained by the following Equation (1):

$$S=(Po/E) \times F/A \qquad (1)$$

In Equation (1), Po is the atmospheric pressure (Pa) outside the chamber 11, E is the internal pressure (Pa) of the chamber 11, F is the flow rate (m$^3$/second) of the inert gas supplied to the chamber 11 at the pressure Po (Pa) at room temperature, A is the cross-sectional area (m$^2$) between the bulging portion 41 and the ingot 25.

Adjusting the flow rate so that the flow velocity index S of the inert gas becomes 2.4 to 5.0 m/second in that manner brings about such effects as cooling the ingot 25 by the inert gas and changing the convection due to the cooling of the silicon melt 12. After flowing down in the gap between the bulging portion 41 and the ingot 25, the inert gas passes through the gap between the surface of the silicon melt 12 and the lower end of the heat shield member 36, and is exhausted from the exhaust pipe 30 outside.

Further, while rotating the quartz crucible 13 at a predetermined rotation speed and rotating the seed crystal 24 in the opposite direction to the rotation of the quartz crucible 13 at a predetermined rotation speed, the ingot 25 is pulled from the silicon melt 12 by pulling the seed crystal 24 immersed in the silicon melt 12. The seed crystal 24 is pulled at a predetermined pull rate profile such that the interior of the ingot 25 becomes a perfect region, in which agglomerates of interstitial silicon-type point defects and agglomerates of vacancy-type point defects are absent.

Figure 3:
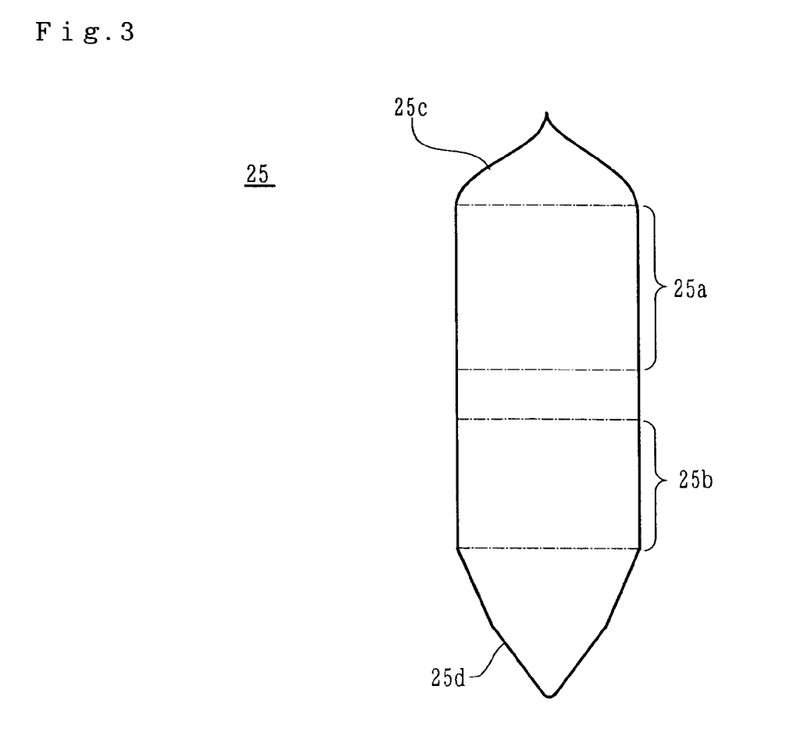
FIG. 3 is a view showing an ingot that is pulled by the equipment.

The ingot 25 also has a top ingot portion 25a that is pulled following the seed crystal 24, and a bottom ingot portion 25b that is pulled following the top ingot portion. The ranges of the top ingot portion 25a and the bottom ingot portion 25b are determined by a solidification rate. Specifically, as shown in FIG. 3, the top ingot portion 25a refers to a portion in which the solidification rate is from 0.15 to 0.30, whereas the bottom ingot portion 25b refers to a portion in which the solidification rate is from 0.50 to 0.65. Note that the term "solidification rate" means the rate of the weight of the pulled ingot 25 to the initial charge weight of the silicon melt 12 that has initially been stored in the quartz crucible 13.

Here, the average rotation speeds of the quartz crucible 13 and the ingot 25 during the pulling of the top ingot portion 25a are referred to as $CR_{TAV}$ and $SR_{TAV}$, respectively, and the average rotation speeds of the quartz crucible 13 and the ingot 25 during the pulling of the bottom ingot portion 25b are referred to as $CR_{BAV}$ and $SR_{BAV}$, respectively. The average rotation speed $CR_{TAV}$ is set to be within the range of 5 to 10 rpm, preferably from 6 to 8 rpm, the average rotation speed $CR_{BAV}$ is set to be within the range of 3 to 8 rpm, preferably 5 to 7 rpm, and the difference between the average rotation speed $CR_{TAV}$ and the average rotation speed $CR_{BAV}$ is set to be within the range of 0.1 to 7 rpm, preferably 1 to 3 rpm.

Figure 9:
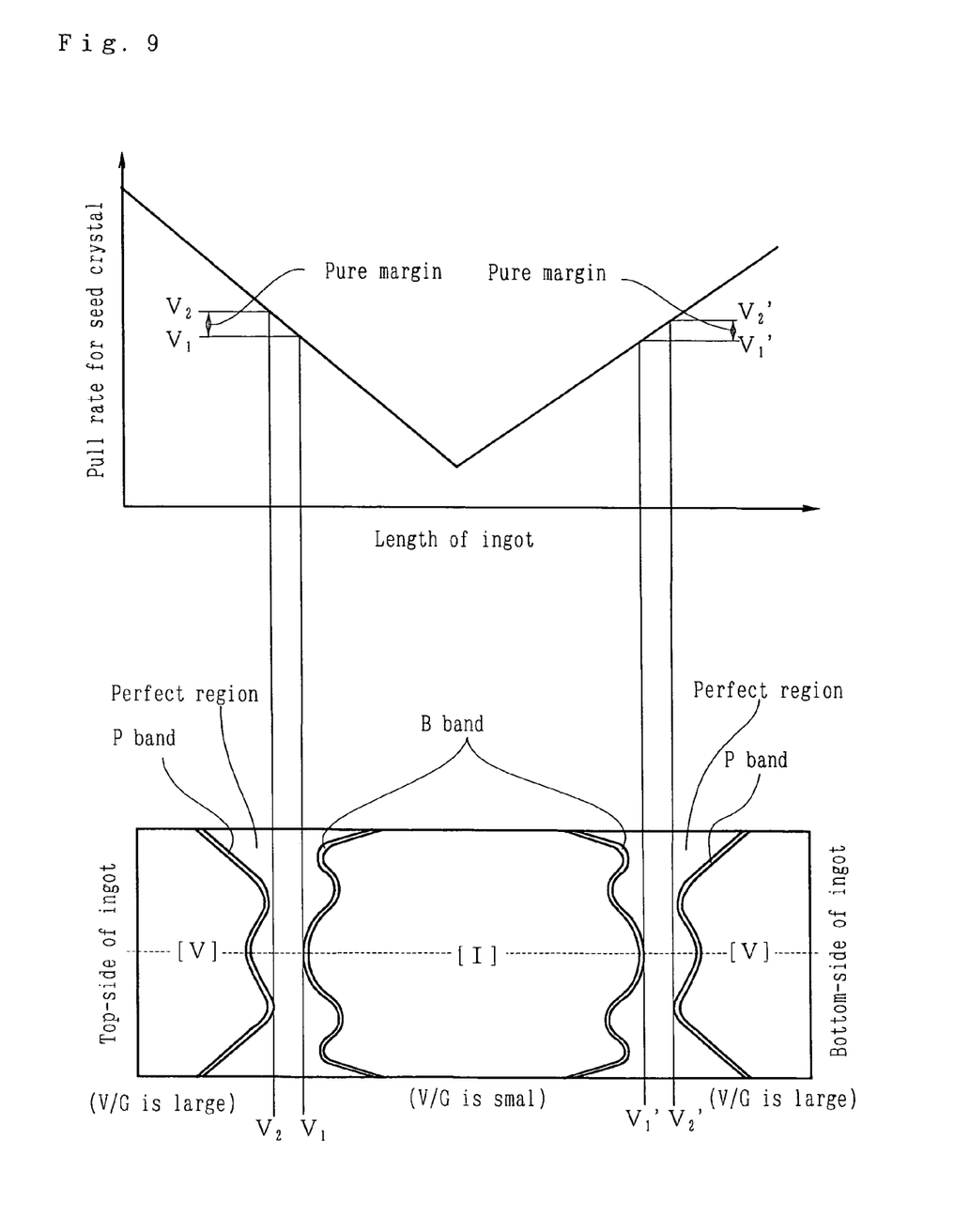
FIG. 9 is an illustration showing a distribution of regions containing interstitial silicons and vacancies in the ingot when the ingot is pulled at a predetermined varying pull rate.

The average rotation speed $CR_{TAV}$ is set in the range of 5 to 10 rpm for the following reason; if it is less than 5 rpm, the pure margin ($V_2-V_1$) (see FIG. 9) is too small, whereas if it exceeds 10 rpm, oxygen included in the silicon melt does not distribute uniformly across the cross section of the ingot 25. Here, as shown in FIG. 9, the term "pure margin" refers to a difference ($V_2-V_1$) or ($V_2'-V_1'$) between a critical pull rate $V_2$ or $V_2'$ at which a perfect region, in which no OSF ring is present, results over the entire cross section of the ingot, and a lower limits $V_1$ or $V_1'$ of the pull rate at which agglomerates of interstitial silicon-type point defects do not occur. Hereafter, where the pure margin is mentioned in the present specification, ($V_2-V_1$) is described as a representative example, and the description regarding ($V_2'-V_1'$) is omitted.

In addition, the average rotation speed $CR_{BAV}$ is set to be in the range of 3 to 8 rpm for the following reason; if it is less than 3 rpm, there is a risk of decreasing the single crystallization rate of the ingot 25 when no magnetic field is applied to the silicon melt 12, whereas if it exceeds 8 rpm, the degree of the solid-liquid interface bulging downwardly becomes large and the axial temperature gradient in the vicinity of the solid-liquid interface becomes non-uniform across diametric directions, resulting in a decrease of the pure margin ($V_2-V_1$) (see FIG. 9). Further, the difference between the average rotation speed $CR_{TAV}$ and the average rotation speed $CR_{BAV}$ is set to be in the range of 0.1 to 7 rpm for the following reason; if it is less than 0.1 rpm, the average rotation speed $CR_{TAV}$ and the average rotation speed $CR_{BAV}$ become nearly the same, whereas if it exceeds 7 rpm, oxygen included in the silicon melt 12 does not distribute uniformly over the cross section of the ingot 25 and there is a risk of decreasing the single crystallization rate of the ingot 25 when no magnetic field is applied to the silicon melt 12.

Figure 4:
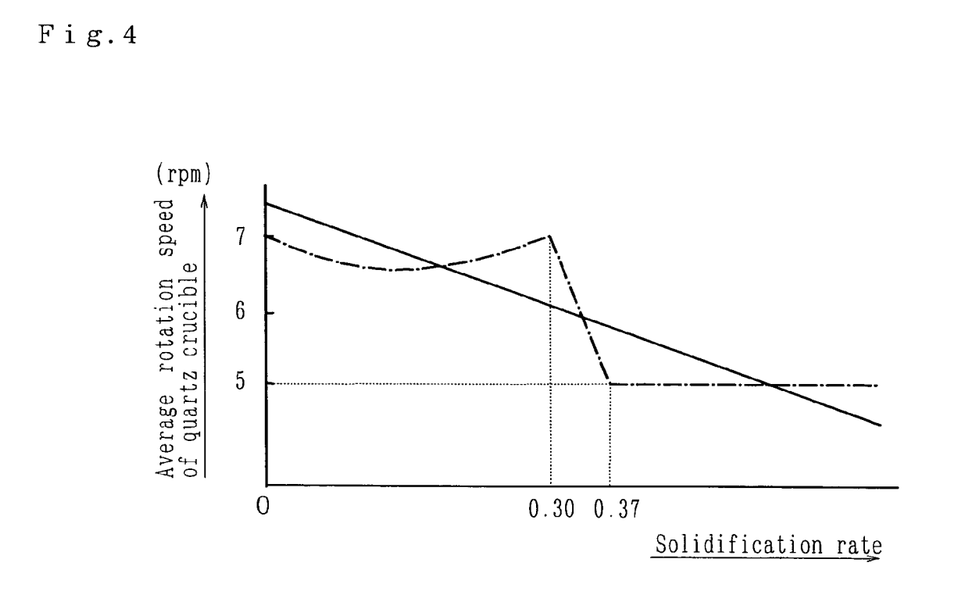
FIG. 4 is a graph showing a change in rotation speed of a quartz crucible relative to a change in solidification rate.

It should be noted that when changing the rotation speed of the quartz crucible 13 from $CR_T$ to $CR_B$, it may be gradually changed from the top ingot portion 25a toward the bottom ingot portion 25b as indicated by the solid line in FIG. 4, or may be abruptly changed at the boundary portion between the top ingot portion 25a and the bottom ingot portion 25b as indicated by the dash-dotted line in FIG. 4. In addition, the rotation speeds $CR_T$ and $CR_B$ of the quartz crucible 13 may be either constant or changed as indicated by the dash-dotted line in FIG. 4.

It is deduced that when pulling the ingot 25 according to the above-described conditions, it was possible to minimize the change in the convection of the silicon melt 12 due to a decrease of the silicon melt 12 within the quartz crucible 13 associated with the pulling of the ingot 25 because the rotation speed $CR_T$ of the quartz crucible 13 during the pulling of the top ingot portion 25a is made faster than the rotation speed $CR_B$ of the quartz crucible 13 during the pulling of the bottom ingot portion 25b. It is considered that as a result of this, the temperature gradient G with respect to the axial direction of the ingot 25 in the vicinity of the solid-liquid interface between the silicon melt 12 and the ingot 25 is distributed substantially uniformly over diametric directions of the ingot 25 substantially over the entire length of the ingot 25, and it was possible to pull the ingot 25 in which no agglomerate of point defects occurred in the pull direction of the ingot 25 and a perfect region resulted substantially over the entire length and entire diameter.

Next, a second method of manufacturing an ingot using the above-described pulling equipment is described below.

First, as in the first method, the flow rate of the inert gas in the chamber 11 is adjusted by adjusting the first and second flow rate-adjusting valves 31 and 32 so that the flow velocity index S of the inert gas that flows down between the bulging portion 41 of the heat shield member 36 and the ingot 25 becomes 2.4 to 5.0 m/second. Next, while rotating the quartz crucible 13 at a predetermined rotation speed and rotating the seed crystal 24 in the opposite direction to the rotation of the quartz crucible 13 at a predetermined rotation speed, the ingot 25 is pulled from the silicon melt 12. Here, a ratio $SR_{TAV}/CR_{TAV}$, which is the ratio of the average rotation speed $SR_{TAV}$ of the ingot 25 and the average rotation speed $CR_{TAV}$ of the quartz crucible 13 during the pulling of top ingot portion 25a of the ingot 25, is set to be the same as a ratio $SR_{BAV}/CR_{BAV}$, which is the ratio of the average rotation speed $SR_{BAV}$ of the ingot 25 and the average rotation speed $CR_{BAV}$ of the quartz crucible 13 during the pulling of the bottom ingot portion 25b of the ingot 25, or to be smaller than the ratio $SR_{BAV}/CR_{BAV}$.

More specifically, the ratio $SR_{TAV}/CR_{TAV}$ is set to be within the range of 2.0 to 3.6, preferably 2.3 to 3.0, and the ratio $SR_{BAV}/CR_{BAV}$ is set to be within the range of 2.0 to 18, preferably 2.3 to 5.0, and in addition, (the ratio $SR_{TAV}/CR_{TAV}$—the ratio $SR_{BAV}/CR_{BAV}$) is set to be in the range of −16 to 0, preferably −1.5 to 0. Here, the ratio $SR_{TAV}/CR_{TAV}$ is set to be in the range of 2.0 to 3.6 for the following reason; if it is less than 2.0, oxygen included in the silicon melt 12 does not distribute uniformly over the cross section of the ingot 25, whereas if it exceeds 3.6, the pure margin $(V_2-V_1)$ (see FIG. 9) becomes small. Also, the ratio $SR_{BAV}/CR_{BAV}$ is set to be in the range of 2.0 to 18 for the following reason; if it is less than 2.0, the pure margin $(V_2-V_1)$ (see FIG. 9) becomes small, whereas if it exceeds 18, there is a risk of decreasing the single crystallization rate of the ingot 25 when no magnetic field is applied to the silicon melt 12. In addition, (the ratio $SR_{TAV}/CR_{TAV}$—the ratio $SR_{BAV}/CR_{BAV}$) is set to be in the range of −16 to 0 for the following reason; if it is less than −16, the change during the pulling of ingot 25 is too large and there is a risk of making the single crystallization of the ingot 25 difficult, whereas if it exceeds 0, the pure margin $(V_2-V_1)$ (see FIG. 9) cannot be obtained sufficiently in the top ingot portion 25a and the bottom ingot portion 25b. Additionally, it is preferable that the average rotation speed $SR_{TAV}$ be set within the range of 18 to 20 rpm and the average rotation speed $CR_{TAV}$ be set within the range of 6 to 8 rpm. Further, it is preferable that the average rotation speed $SR_{BAV}$ be set within the range of 18 to 20 rpm and the average rotation speed $CR_{BAV}$ be set within the range of 5 to 7 rpm.

It is deduced that when pulling the ingot 25 according to the above-described conditions, it was possible to minimize the change in convection of the silicon melt 12 caused by a decrease of the silicon melt 12 in the quartz crucible 13 accompanying the pulling of the ingot 25. It is considered that as a result of this, the temperature gradient G with respect to the axial direction of the ingot 25 in the vicinity of the solid-liquid interface between the silicon melt 12 and the ingot 25 is distributed substantially uniformly over diametric directions of the ingot 25 over the entire length of the ingot 25; thus, it became possible to pull the ingot 25 in which no agglomerate of point defects occurred in the pull direction of the ingot 25 and a perfect region resulted substantially over the entire length and entire diameter.

Next, examples of the present invention are described in detail along with a comparative example.

EXAMPLE 1

Figure 5:
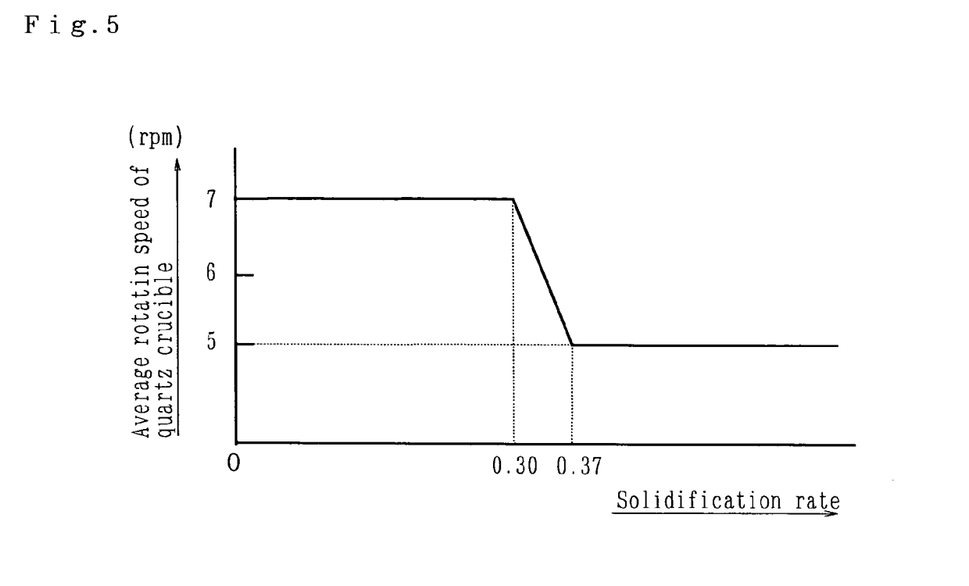
FIG. 5 is a graph showing a change in rotation speed of a quartz crucible relative to a change in solidification rate of Example 1.

First, with the use of the pulling equipment 10 shown in FIG. 1, 120 kg poly-silicon (polycrystalline silicon) material was charged, and an ingot 25 having a diameter of about 200 mm was pulled. Next, the rotation speed of the quartz crucible 13 was varied as shown in FIG. 5, whereas the rotation speed of the ingot 25 was made constant, at 18 rpm over the entire length of the ingot, where rotation speeds of the quartz crucible 13 and the ingot 25 during the pulling of the top ingot portion 25a are referred to as $CR_T$ and $SR_T$, respectively, and rotation speeds of the quartz crucible 13 and the ingot 25 during the pulling of the bottom ingot portion 25b are referred to as $CR_B$ and $SR_B$, respectively. The ingot thus pulled at a predetermined varying pull rate is referred to as Example 1.

EXAMPLE 2

Figure 6:
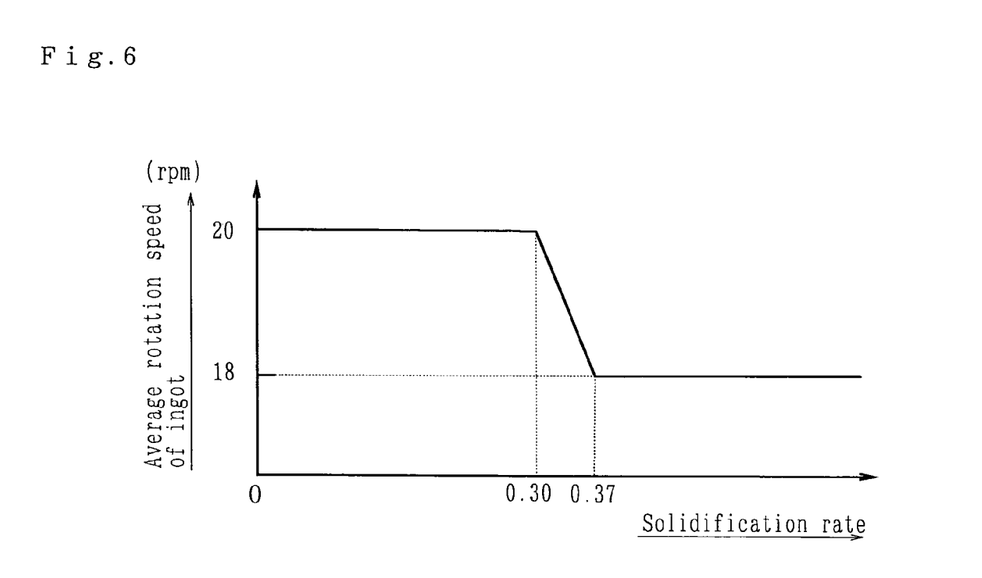
FIG. 6 is a graph showing a change in rotation speed of the ingot relative to a change in solidification rate of Example 2.

An ingot was pulled in the same manner as in Example 1 except that the rotation speed of the ingot was varied as shown in FIG. 6. The ingot thus produced is referred to as Example 2.

Comparative Example 1

Figure 7:
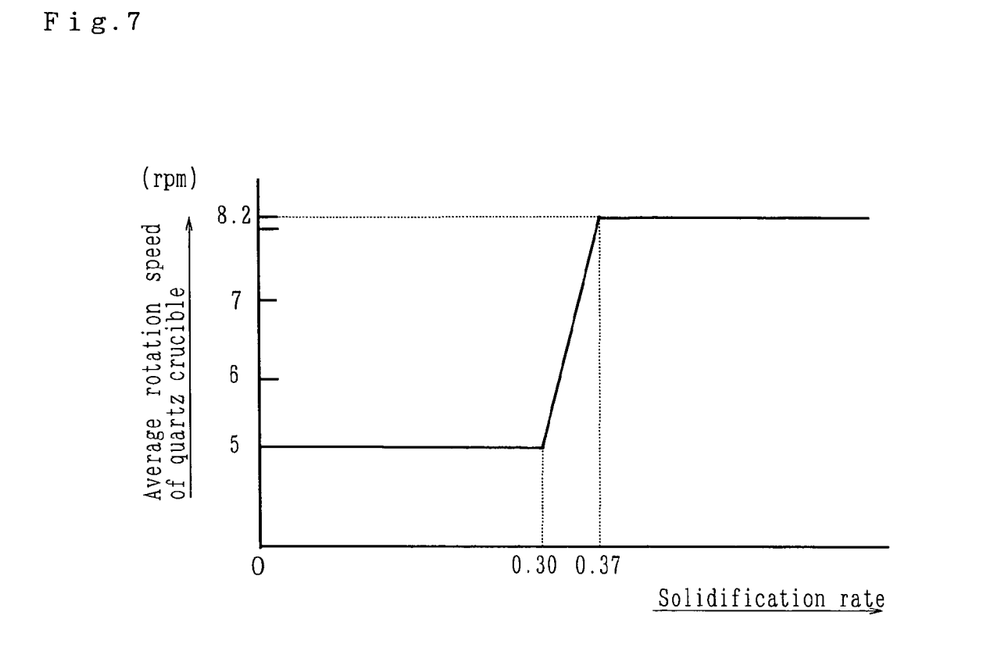
FIG. 7 is a graph showing a change in rotation speed of a quartz crucible relative to a change in solidification rate of Comparative Example 1.
Figure 8:
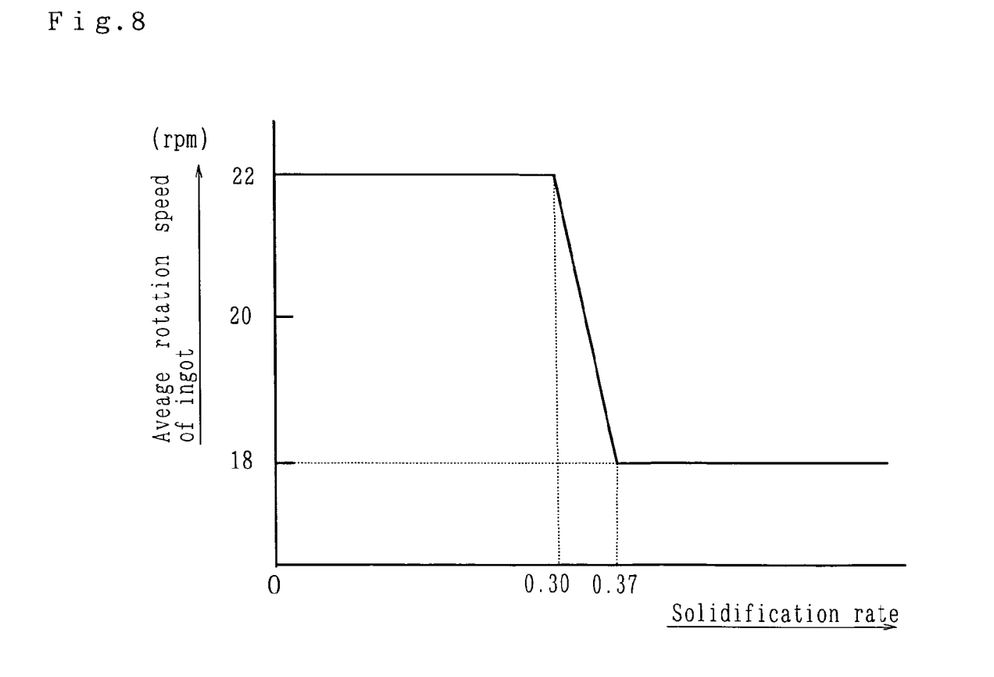
FIG. 8 is a graph showing a change in rotation speed of the ingot relative to a change in solidification rate of Comparative Example 1.

An ingot was pulled in the same manner as in Example 1 except that the rotation speed of the quartz crucible 13 was varied as shown in FIG. 7 and the rotation speed of the ingot was varied as shown in FIG. 8. The ingot thus produced is referred to as Comparative Example 1.

Comparative Test and Evaluation

The ingots of Example 1, Example 2, and Comparative Example 1 were axially sliced and then subjected to a predetermined heat treatment, and their lifetimes were measured to obtain pure margins $(V_2-V_1)$ shown in FIG. 9. The results are shown in Table 1 below. In Table 1, the pure margins $(V_2-V_1)$ are represented taking the pure margin $(V_2-V_1)$ of the top ingot portion of Comparative Example 1 as a reference.

TABLE 1

| | Top ingot portion | | | | Bottom ingot portion | | | |
|---|---|---|---|---|---|---|---|---|
| | $SR_T$ (rpm) | $CR_T$ (rpm) | $SR_T/CR_T$ | $V_2 - V_1$ (mm/min) | $SR_B$ (rpm) | $CR_B$ (rpm) | $SR_B/CR_B$ | $V_2 - V_1$ (mm/min) |
| Example 1 | 18 | 7 | 2.57 | 1.67 | 18 | 5 | 3.60 | 1.67 |
| Example 2 | 20 | 7 | 2.86 | 1.67 | 18 | 5 | 3.60 | 1.67 |
| Comparative Example 1 | 22 | 5 | 4.40 | 1.00 | 18 | 8.2 | 2.20 | 1.27 |

As is clearly seen from Table 1, the pure margins of Comparative Example 1 were small, 1.00 during the pulling of the top ingot portion and 1.27 during the pulling of the bottom ingot portion. In contrast, the pure margins of Examples 1 and 2 were large, 1.67 during both the pulling of the top ingot portion and the pulling of the bottom ingot portion.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A method of manufacturing a silicon single crystal, comprising rotating a quartz crucible (13) for storing a silicon melt (12) at a rotation speed, rotating a silicon single crystal ingot (25) pulled from the silicon melt (12) in an opposite direction to the rotation of the quartz crucible (13) at a rotation speed, and pulling the silicon single crystal ingot (25) at a pull rate such that an interior of the silicon single crystal ingot (25) becomes a perfect region in which agglomerates of interstitial silicon point defects and agglomerates of vacancy point defects are absent:

wherein an average rotation speed $CR_{TAV}$ of the quartz crucible (13) during the pulling of a top ingot portion (25a) of the silicon single crystal ingot (25) is set faster than an average rotation speed $CR_{BAV}$ of the quartz crucible (13) during the pulling of a bottom ingot portion (25b) of the silicon single crystal ingot (25).

2. The method of manufacturing a silicon single crystal according to claim 1, wherein the average rotation speed $CR_{TAV}$ is set to be within the range of from 5 to 10 rpm, the average rotation speed $CR_{BAV}$ is set to be within the range of from 3 to 8 rpm, and the difference between the average rotation speed $CR_{TAV}$ and the average rotation speed $CR_{BAV}$ is set to be within the range of from 0.1 to 7 rpm.

3. The method of manufacturing a silicon single crystal according to claim 2, wherein:

a heat shield member (36) is interposed between an outer circumferential surface of the silicon single crystal ingot (25) pulled from the silicon melt (12) and a heater (13) surrounding the quartz crucible (13);

the heat shield member (36) is positioned above a surface of the silicon melt (12) at a gap and has a cylindrical portion (37) surrounding the outer circumferential surface of the silicon single crystal ingot (25), and a bulging portion (41) provided at a lower portion of the cylindrical portion (37) bulging inwardly of the cylindrical portion and having a heat-storing member (47) in an interior thereof; and a diameter d is 100 mm or more where d is a diameter of the silicon single crystal ingot (25), a height ($H_1$) of an inner circumferential surface of the heat-storing member (47) is 10 to d/2 mm, and a minimum gap ($W_1$) between an inner circumferential surface of the heat-storing member (47) and the outer circumference of the silicon single crystal ingot (25) is 10 to 0.2 d mm.

4. The method of manufacturing a silicon single crystal according to claim 3, wherein a flow velocity index S of an inert gas that flows down in a gap between the bulging portion (41) and the silicon single crystal ingot (25) is set to be 2.4 to 5.0 m/s, the flow velocity index S being obtained by the following Equation (1):

$$S=(Po/E) \times F/A \qquad (1)$$

where Po is an atmospheric pressure (Pa) outside an chamber (11), E is an internal pressure (Pa) of the chamber (11), F is a flow rate (m³/second) of the inert gas supplied to the chamber (11) at the pressure Po (Pa) at room temperature, and A is a cross-sectional area (m²) of a gap between the bulging portion (41) and the silicon single crystal ingot (25).

5. The method of manufacturing a silicon single crystal according to claim 2, wherein a flow velocity index S of an inert gas that flows down in a gap between the bulging portion (41) and the silicon single crystal ingot (25) is set to be 2.4 to 5.0 m/s, the flow velocity index S being obtained by the following Equation (1):

$$S=(Po/E) \times F/A \qquad (1)$$

where Po is an atmospheric pressure (Pa) outside an chamber (11), E is an internal pressure (Pa) of the chamber (11), F is a flow rate (m³/second) of the inert gas supplied to the chamber (11) at the pressure Po (Pa) at room temperature, and A is a cross-sectional area (m²) of a gap between the bulging portion (41) and the silicon single crystal ingot (25).

6. The method of manufacturing a silicon single crystal according to claim 1, wherein:

a heat shield member (36) is interposed between an outer circumferential surface of the silicon single crystal ingot (25) pulled from the silicon melt (12) and a heater (13) surrounding the quartz crucible (13);

the heat shield member (36) is positioned above a surface of the silicon melt (12) at a gap and has a cylindrical portion (37) surrounding the outer circumferential surface of the silicon single crystal ingot (25), and a bulging portion (41) provided at a lower portion of the cylindrical portion (37) bulging inwardly of the cylindrical portion and having a heat-storing member (47) in an interior thereof; and a diameter d is 100 mm or more where d is a diameter of the silicon single crystal ingot (25), a height ($H_1$) of an inner circumferential surface of the heat-storing member (47) is 10 to d/2 mm, and a minimum gap ($W_1$) between an inner circumferential surface of the heat-storing member (47) and the outer circumference of the silicon single crystal ingot (25) is 10 to 0.2 d mm.

7. The method of manufacturing a silicon single crystal according to claim 6, wherein a flow velocity index S of an inert gas that flows down in a gap between the bulging portion (41) and the silicon single crystal ingot (25) is set to be 2.4 to 5.0 m/s, the flow velocity index S being obtained by the following Equation (1):

$$S=(Po/E) \times F/A \qquad (1)$$

where Po is an atmospheric pressure (Pa) outside an chamber (11), E is an internal pressure (Pa) of the chamber (11), F is a flow rate (m³/second) of the inert gas supplied to the chamber (11) at the pressure Po (Pa) at room temperature, and A is a cross-sectional area (m²) of a gap between the bulging portion (41) and the silicon single crystal ingot (25).

8. The method of manufacturing a silicon single crystal according to claim 1, wherein a flow velocity index S of an inert gas that flows down in a gap between the bulging portion (41) and the silicon single crystal ingot (25) is set to be 2.4 to 5.0 m/s, the flow velocity index S being obtained by the following Equation (1):

$$S=(Po/E)\times F/A \qquad (1)$$

where Po is an atmospheric pressure (Pa) outside an chamber (11), E is an internal pressure (Pa) of the chamber (11), F is a flow rate (m³/second) of the inert gas supplied to the chamber (11) at the pressure Po (Pa) at room temperature, and A is a cross-sectional area (m²) of a gap between the bulging portion (41) and the silicon single crystal ingot (25).

9. A silicon single crystal manufactured by a method according to claim 1.

10. A method of manufacturing a silicon single crystal, comprising rotating a quartz crucible (13) for storing a silicon melt (12) at a rotation speed, rotating a silicon single crystal ingot (25) pulled from the silicon melt (12) in an opposite direction to the rotation of the quartz crucible (13) at a rotation speed, and pulling the silicon single crystal ingot (25) at a pull rate such that an interior of the silicon single crystal ingot (25) becomes a perfect region in which agglomerates of interstitial silicon point defects and agglomerates of vacancy point defects are absent:
wherein a ratio $SR_{TAV}/CR_{TAV}$ of an average rotation speed $SR_{TAV}$ of the silicon single crystal ingot (25) and an average rotation speed $CR_{TAV}$ of the quartz crucible (13) during the pulling of a top ingot portion (25a) of the silicon single crystal ingot (25) is set to be equal to or smaller than a ratio $SR_{BAV}/CR_{BAV}$ of an average rotation speed $SR_{BAV}$ of the silicon single crystal ingot (25) and an average rotation speed $CR_{BAV}$ of the quartz crucible (13) during the pulling of a bottom ingot portion (25b) of the silicon single crystal ingot (25).

11. The method of manufacturing a silicon single crystal according to claim 10, wherein the ratio $SR_{TAV}/CR_{TAV}$ is set to be within the range of from 2.0 to 3.6, the ratio $SR_{BAV}/CR_{BAV}$ is set to be within the range of from 2.0 to 18, and (the ratio $SR_{TAV}/CR_{TAV}$–the ratio $SR_{BAV}/CR_{BAV}$) is set to be within the range of from –16 to 0.

12. The method of manufacturing a silicon single crystal according to claim 11, wherein:
a heat shield member (36) is interposed between an outer circumferential surface of the silicon single crystal ingot (25) pulled from the silicon melt (12) and a heater (13) surrounding the quartz crucible (13);
the heat shield member (36) is positioned above a surface of the silicon melt (12) at a gap and has a cylindrical portion (37) surrounding the outer circumferential surface of the silicon single crystal ingot (25), and a bulging portion (41) provided at a lower portion of the cylindrical portion (37) bulging inwardly of the cylindrical portion and having a heat-storing member (47) in an interior thereof; and
a diameter d is 100 mm or more where d is a diameter of the silicon single crystal ingot (25), a height ($H_1$) of an inner circumferential surface of the heat-storing member (47) is 10 to d/2 mm, and a minimum gap ($W_1$) between an inner circumferential surface of the heat-storing member (47) and the outer circumference of the silicon single crystal ingot (25) is 10 to 0.2 d mm.

13. The method of manufacturing a silicon single crystal according to claim 12, wherein a flow velocity index S of an inert gas that flows down in a gap between the bulging portion (41) and the silicon single crystal ingot (25) is set to be 2.4 to 5.0 m/s, the flow velocity index S being obtained by the following Equation (1):

$$S=(Po/E)\times F/A \qquad (1)$$

where Po is an atmospheric pressure (Pa) outside an chamber (11), E is an internal pressure (Pa) of the chamber (11), F is a flow rate (m³/second) of the inert gas supplied to the chamber (11) at the pressure Po (Pa) at room temperature, and A is a cross-sectional area (m²) of a gap between the bulging portion (41) and the silicon single crystal ingot (25).

14. The method of manufacturing a silicon single crystal according to claim 11, wherein a flow velocity index S of an inert gas that flows down in a gap between the bulging portion (41) and the silicon single crystal ingot (25) is set to be 2.4 to 5.0 m/s, the flow velocity index S being obtained by the following Equation (1):

$$S=(Po/E)\times F/A \qquad (1)$$

where Po is an atmospheric pressure (Pa) outside an chamber (11), E is an internal pressure (Pa) of the chamber (11), F is a flow rate (m³/second) of the inert gas supplied to the chamber (11) at the pressure Po (Pa) at room temperature, and A is a cross-sectional area (m²) of a gap between the bulging portion (41) and the silicon single crystal ingot (25).

15. The method of manufacturing a silicon single crystal according to claim 10, wherein:
a heat shield member (36) is interposed between an outer circumferential surface of the silicon single crystal ingot (25) pulled from the silicon melt (12) and a heater (13) surrounding the quartz crucible (13);
the heat shield member (36) is positioned above a surface of the silicon melt (12) at a gap and has a cylindrical portion (37) surrounding the outer circumferential surface of the silicon single crystal ingot (25), and a bulging portion (41) provided at a lower portion of the cylindrical portion (37) bulging inwardly of the cylindrical portion and having a heat-storing member (47) in an interior thereof; and
a diameter d is 100 mm or more where d is a diameter of the silicon single crystal ingot (25), a height ($H_1$) of an inner circumferential surface of the heat-storing member (47) is 10 to d/2 mm, and a minimum gap ($W_1$) between an inner circumferential surface of the heat-storing member (47) and the outer circumference of the silicon single crystal ingot (25) is 10 to 0.2 d mm.

16. The method of manufacturing a silicon single crystal according to claim 15, wherein a flow velocity index S of an inert gas that flows down in a gap between the bulging portion (41) and the silicon single crystal ingot (25) is set to be 2.4 to 5.0 m/s, the flow velocity index S being obtained by the following Equation (1):

$$S=(Po/E)\times F/A \qquad (1)$$

where Po is an atmospheric pressure (Pa) outside an chamber (11), E is an internal pressure (Pa) of the chamber (11), F is a flow rate (m³/second) of the inert gas supplied to the chamber (11) at the pressure Po (Pa) at room temperature, and A is a cross-sectional area (m²) of a gap between the bulging portion (41) and the silicon single crystal ingot (25).

17. The method of manufacturing a silicon single crystal according to claim 10, wherein a flow velocity index S of an inert gas that flows down in a gap between the bulging portion (41) and the silicon single crystal ingot (25) is set to be 2.4 to 5.0 m/s, the flow velocity index S being obtained by the following Equation (1):

$$S = (Po/E) \times F/A \qquad (1)$$

where Po is an atmospheric pressure (Pa) outside an chamber (11), E is an internal pressure (Pa) of the chamber (11), F is a flow rate (m³/second) of the inert gas supplied to the chamber (11) at the pressure Po (Pa) at room temperature, and A is a cross-sectional area (m²) of a gap between the bulging portion (41) and the silicon single crystal ingot (25).

18. A silicon single crystal manufactured by a method according to claim 10.

* * * * *